(12) United States Patent
Mannion et al.

(10) Patent No.: US 9,726,704 B2
(45) Date of Patent: Aug. 8, 2017

(54) RADIATION MEASUREMENT SYSTEM AND METHOD WITH SYNCHRONOUS HIGH SPEED TRACKING LASER BASED POSITION MEASUREMENT

(71) Applicant: MI TECHNOLOGIES, LLC, Suwanee, GA (US)

(72) Inventors: Martin Mannion, Suwanee, GA (US); Charles P. B. Pinson, Alpharetta, GA (US); Jeffrey Fordham, Cumming, GA (US); Marion Baggett, Alpharetta, GA (US)

(73) Assignee: NSI-MI Technologies, LLC, Suwanee, GA (US)

( * ) Notice: Subject to any disclaimer, the term of this patent is extended or adjusted under 35 U.S.C. 154(b) by 235 days.

(21) Appl. No.: 14/527,393

(22) Filed: Oct. 29, 2014

(65) Prior Publication Data

US 2015/0116164 A1 Apr. 30, 2015

Related U.S. Application Data

(60) Provisional application No. 61/897,143, filed on Oct. 29, 2013.

(51) Int. Cl.
*G01R 29/10* (2006.01)
*G01R 1/07* (2006.01)
*G01R 31/00* (2006.01)

(52) U.S. Cl.
CPC ............... *G01R 29/10* (2013.01); *G01R 1/07* (2013.01); *G01R 31/001* (2013.01)

(58) Field of Classification Search
CPC .......... G01R 1/07; G01R 29/10; G01R 29/08; G01R 31/001
(Continued)

(56) References Cited

U.S. PATENT DOCUMENTS

| | | | | |
|---|---|---|---|---|
| 5,410,324 A | * | 4/1995 | Bolomey | G01R 29/10 343/703 |
| 5,432,523 A | * | 7/1995 | Simmers | G01R 29/10 342/360 |

(Continued)

*Primary Examiner* — Tho G. Phan
(74) *Attorney, Agent, or Firm* — Dentons US LLP

(57) ABSTRACT

An Antenna measurement system incorporating high speed tracking laser-based global positioning capture synchronized with radio frequency (RF) measurements. A high speed tracking laser is used for collecting RF probe position data synchronously with corresponding near-field RF measurements. The probe may be moved across an arbitrary surface surrounding or adjacent to a device under test (DUT); however, it is not necessary for the probe position to be perfectly coincident with the surface, or any of the discrete points which make up the surface. Here, the probe position is determined relative to a global positioning coordinate system which is defined by a set of monuments which are in known positions relative to the global positioning coordinate system, and not the DUT. Any difference between the actual position of the probe, in the global position coordinate system, and a given one of the discrete measuring points, in the global position coordinate system, on the surface surrounding or adjacent to the DUT can be accounted for during post processing, thus eliminating the need for advanced or intermittent calibration to achieve precise near-field measurements.

6 Claims, 6 Drawing Sheets

(58) Field of Classification Search
USPC ..... 343/703; 250/351, 393, 515.1; 422/68.1, 422/82.01, 82.03
See application file for complete search history.

(56) References Cited

U.S. PATENT DOCUMENTS

| | | | | |
|---|---|---|---|---|
| 6,750,822 B2* | 6/2004 | Fritzel | ................... | G01R 29/10 343/703 |
| 6,914,571 B1* | 7/2005 | Lemanczyk | ........... | G01R 29/10 250/515.1 |
| 7,280,077 B2* | 10/2007 | Woo | ...................... | G01R 29/10 343/703 |
| 7,755,550 B2* | 7/2010 | Hess | ...................... | G01R 29/10 343/703 |
| 8,410,987 B2* | 4/2013 | Eibert | ................... | G01R 29/10 343/703 |
| 8,643,553 B2* | 2/2014 | Teshirogi | ............... | G01R 29/10 343/703 |
| 2011/0102277 A1* | 5/2011 | Eibert | ................... | G01R 29/10 343/703 |

* cited by examiner

RADIATION MEASUREMENT SYSTEM AND METHOD WITH SYNCHRONOUS HIGH SPEED TRACKING LASER BASED POSITION MEASUREMENT

This application claims priority to U.S. Provisional Application No. 61/897,143, filed Oct. 29, 2013, the contents of which are incorporated herein by reference in its entirety.

FIELD OF THE INVENTION

The present invention relates to high accuracy radiation measurement systems, and more particularly, to an antenna measurement system that incorporates high speed tracking laser-based global positioning capture synchronized with radio frequency (RF) measurements.

BACKGROUND

Sophisticated high performance antennas are commonly used in both commercial and military applications. With respect to commercial applications, high performance antennas are used, for example, to support high speed voice, data, and video communications. In military applications, high performance antennas are, for example, used in conjunction with satellite communications; unmanned aerial vehicles; and various aircraft, ship and ground vehicle missions.

Equally sophisticated antenna measurement systems are used in the development, manufacturing, and maintenance of these high performance antennas. Well known near-field antenna measurement systems provide a convenient method for testing or otherwise measuring the performance of these antennas. Near-field testing is typically conducted indoors, in a relatively small, confined space. The testing equipment generally includes, among other things, a an RF probe antenna (hereafter "probe") that is scanned over an arbitrary, geometric surface surrounding, or adjacent to, the device (e.g., antenna) under test (DUT). The distance or range between the DUT and the probe may be very short, even to the point where the probe nearly touches the DUT. During the testing, near-field voltage data (both phase and amplitude) is collected as the probe moves over or past each of a plurality of discrete measurement points which lie on and define the aforementioned surface. The near-field voltage data is then transformed into far-field data using well-known Fourier techniques. The resulting far-field data can then be displayed or otherwise used to assess the conventional far-field performance for the DUT without having to make actual far-field measurements.

The near-field measurements must be extremely precise because small errors in the near-field measurements translate into large errors when the near-field data is transformed into far-field data. Thus, any variance in the actual position of the probe and each of the plurality of discrete measurement points will result in significant errors when the near-field data is transformed into far-field data. Prior art systems have focused on two general approaches in an attempt to minimize near-field data measurement errors.

The first prior art approach involves attaching the probe to equipment that is made of strong, rigid material; material which is not susceptible, for example, to mechanical oscillations when moved or material deformation due to wear and tear over time or changes in environmental conditions, such as thermal drift within the testing chamber. Near-field measurement systems that employ such equipment, in combination with highly precise position control systems, are able to better insure that the probe is positioned on or extremely close to the each of the plurality of discrete measurement points when each corresponding RF measurement is made. The problem with this approach is that such measurements systems are extremely costly, and still some error can still be expected.

The second prior art approach generally involves calibrating the test equipment in advance of capturing near-field data measurements. For example, U.S. Pat. No. 5,419,631 describes a measurement system which compensates for probe position errors due to thermal drift. More specifically, these position errors are identified by a three-axis motion tracking interferometer apparatus that performs a distance measurement between the DUT and the probe at the specified measurement points. These distance measurements occur periodically throughout the RF data collection. Then, during post processing a simple phase correction based on frequency and change in distance measured at a few points is applied to the plurality of measurement points. The problem with prior art systems such as this is that the process of collecting the distance measurements for purposes of calibration takes a significant period of time and, moreover, any variance in the conditions when the calibration measurements are taken compared to when the RF measurements are taken, will cause the calibration data to be inaccurate, leading to inaccuracies in the near-field data and, more significantly, inaccuracies when the near-field data is transformed to far-field data. A further limitation is that this simple phase correction in effect results in a single pointing direction correction rather than a plurality of pointing directions.

Accordingly, better systems and methods are needed to provide high speed, accurate near-field RF measurements, particularly for electrically large antennas, without the need for extremely expensive equipment and/or materials. These systems and methods must also effectively measure a wide variety of modern high performance antennas using any standard near-field techniques including planar, cylindrical, or spherical techniques.

SUMMARY OF THE INVENTION

The present invention obviates the deficiencies associated with the prior art in that it provides a near-field RF measurement system and method that is capable of generating highly accurate antenna radiation pattern measurements using a low-cost mechanical structure. This is achieved through the use of a high speed tracking laser for collecting probe position data synchronously with corresponding near-field RF measurements. While the probe may be moved across an arbitrary surface surrounding or adjacent to the DUT, it is not necessary for the probe position to be perfectly coincident with the surface, or any of the plurality of discrete points which make up the surface, as with prior art systems. That is because probe position is determined relative to a global positioning coordinate system which is defined by a set of monuments which are in known positions relative to the global positioning coordinate system within the test chamber itself, and not the DUT. Any difference between the actual position of the probe, in the global position coordinate system, and a given one of the discrete measuring points, in the global position coordinate system, on the surface surrounding or adjacent to the DUT can be accounted for during post processing in accordance with well-known techniques. Thus, advanced or intermittent calibration, associated with certain prior art systems, is not critical to obtaining precise near-field measurements, nor is the costly mechanical systems associated with other prior art systems.

Thus, one advantage of the present invention is that calibration prior to or intermittent to the collection of RF measurements is not necessary to obtain precise near-field measurements.

Another advantage of the present invention is that expensive, high performance mechanical structures are not necessary to obtain precise near-field RF measurements.

BRIEF DESCRIPTION OF THE DRAWINGS

Several figures are provided herein to further the explanation of the present invention. More specifically.

DETAILED DESCRIPTION OF THE INVENTION

It is to be understood that both the foregoing general description and the following detailed description are exemplary. The descriptions herein are not intended to limit the scope of the present invention. The scope of the present invention is governed by the scope of the appended claims.

Figure 1:
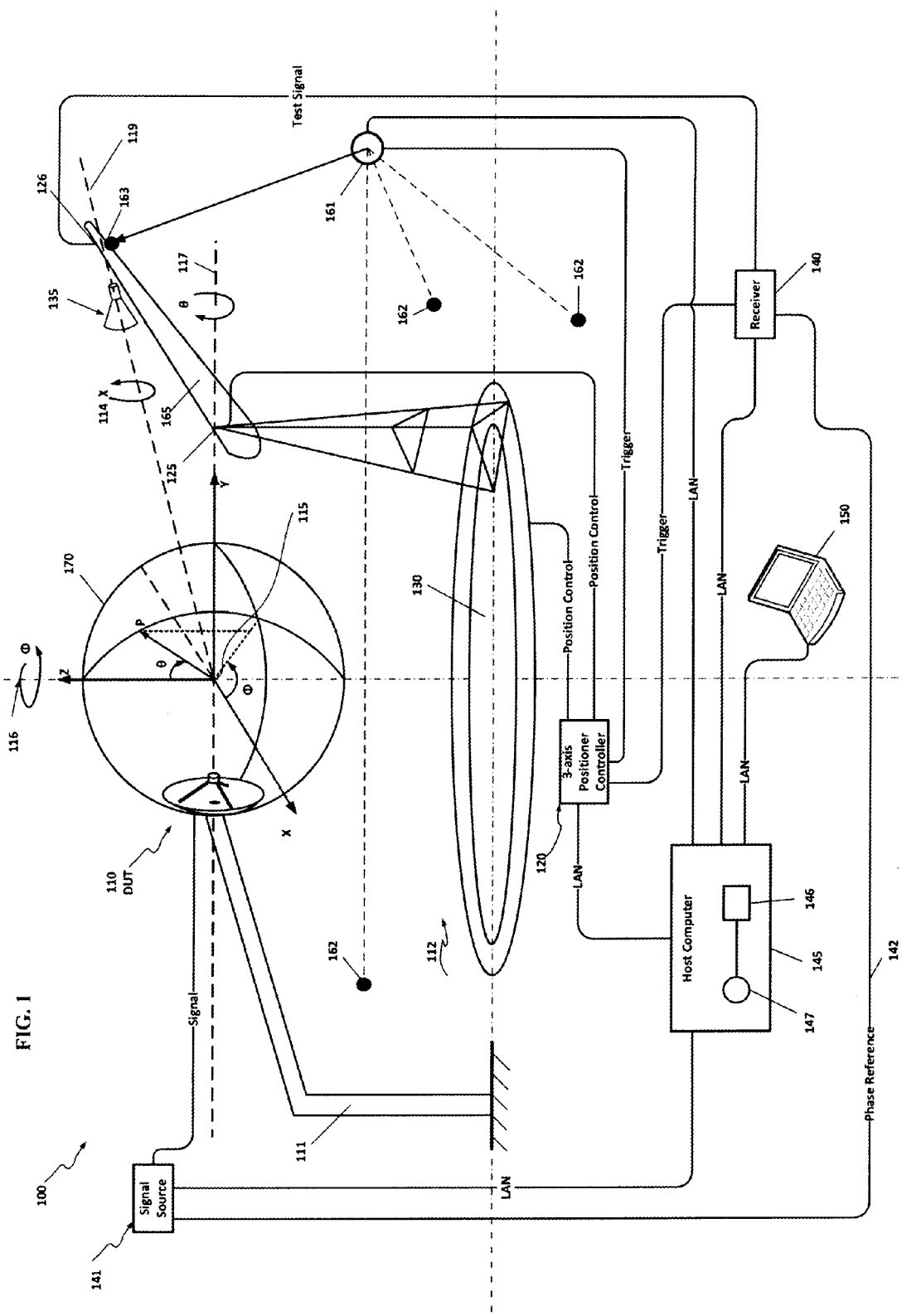
FIG. 1 is a diagram of an radiation measurement system in accordance with exemplary embodiments of the present invention.

FIG. 1. illustrates a near-field measurement system 100, which also computes device far-field radiation patterns according to an exemplary embodiment of the present invention. System 100 includes a device under test (DUT) 110, which may be an antenna mounted to a support structure 111. DUT 110 may be connected to a signal source 141.

DUT 110 may be mounted to a support structure 111, near a three-axis positioner 112, which controls the orientation of a probe 135 aligned to a coordinate system having an origin 115 defined by the crossing of a phi axis 116 and a theta axis 117. This coordinate system is referred to herein as the global position coordinate system and it is defined by a plurality of monuments known as spherically mounted retroreflectors (SMRs) 162 positioned around the testing site or chamber. Thus the global position coordinate system is fixed relative to the testing site or chamber.

System 100 further includes a scan probe 135, which may be a microwave horn antenna. Probe 135 may be mounted substantially to a three-axis positioner 112 having a "theta axis" 117 and a "phi axis" 116 and "chi axis" 114 aligned along a variable range axis 119 from origin 115 at a prescribed distance. Accordingly, system 100 may be referred to as a "moving line of sight" antenna measurement system. Probe 135 may be a vertically or horizontally polarized single-ported microwave horn antenna. In this case, probe 135 may be mounted so that its polarization orientation may be re-oriented, either manually or by a rotational actuator 126. Probe 135 may be connected to receiver 140, which may be connected to host computer 145. Signal source 141 may provide a phase reference signal 142 to receiver 140, which receiver 140 uses to determine the phase of the signal detected by probe 135, as discussed below. Signal source 141 may also be connected to host computer 145.

System 100 further includes a tracking laser device 161 and a plurality of monuments or spherically mounted retroreflectors (SMRs) 162 positioned at various locations about or within the physical environment of the system 100 (e.g., within the test chamber). As previously mentioned the global position coordinate system is fixed relative to these monuments. System 100 also includes SMR 163 mounted in a fixed relationship near the probe 135.

Host computer 145 may include a processor 146, and a memory 147. Memory 147 may be encoded with a set of computer instructions and data (hereinafter "instructions" or "the software"), which processor 146 executes in performing processes associated with the present invention. Host computer 145 may be connected to a user interface 150. Host computer 145 may include one or more computers that may be co-located or connected over a distributed network such as a LAN, WAN, or the internet. Memory 147 may include a single memory device, or may include a plurality of memory devices and databases that may be distributed over a network. One skilled in the art will readily appreciate that many variations to host computer 145, processor 146, memory 147, and user interface 150, are possible and within the scope of the invention.

As stated, DUT 110 may be a microwave horn antenna. Alternatively, it may be a patch antenna, a dipole, a monopole, a wire antenna, or a plurality of the aforementioned basic devices. DUT 110 is illustrated in FIG. 1 as being offset from origin 115, as a generalized case; however, one skilled in the art would infer that the DUT 110 could be mounted at the origin 115.

Three-axis position control system 112 may include a three-axis position controller 120, a theta rotational actuator 125, a chi rotational actuator 126 and a phi rotational actuator 130. Three-axis position controller 120 accepts commands from host computer 145 and converts the commands into control signals for theta rotational actuator 125, chi rotational actuator 126, and phi rotational actuator 130 in order to move and/or scan probe 135. Phi actuator 130 rotates three-axis positioner 112 around phi axis 116 by an angular change $\Delta\phi$. Rotational actuator 125 rotates a gantry arm 165 around theta axis 117 by an angular change $\Delta\theta$. As illustrated in FIG. 1, phi axis 116 may lie in a vertical plane and may remain fixed during actual RF measurements, whereas theta axis 117 may lie in a horizontal plane and rotate around phi axis 116 during actual RF measurements. Accordingly, three-axis position control system 112 may orient probe 135 at any series of specified three-axis angular orientations to perform a spherical near-field scan of DUT 110. Three-axis position control system 112 may have sufficient precision to establish and maintain a three-axis orientation of DUT 110 with sufficient accuracy to perform a near-field scan at specified angular sample spacing as described below.

Three-axis position control system 112 may include manual controllers in place of or in conjunction with theta rotational actuator 125, chi rotational actuator 126 and phi rotational actuator 130. Further, three-axis position control system 112 may include more than, or fewer than, three axes of control. It will be readily apparent to one of ordinary skill that many variations to three-axis position control system 112 are possible and within the scope of the invention.

A near-field radiation pattern data is acquired, for example, by using system 100. Near-field radiation pattern data may be collected by transmitting an RF signal through antenna 110 (using signal source 141) at a wavelength of interest λ, and detecting the transmitted RF voltage signal (in amplitude and phase) using probe 135. With probe 135 fixed, and with three-axis position control system 120 orienting three-axis positioner 112, the transmitted RF voltage signal is detected for a plurality of orientations such that data is acquired at angular sample spacing Δθ and Δϕ on or proximate to a scan surface. In FIG. 1, the scan surface 170 is spherical. System 100 may be further used to capture the plurality of position data of the three-axis positioner when RF voltage signals are measured.

Figure 2:
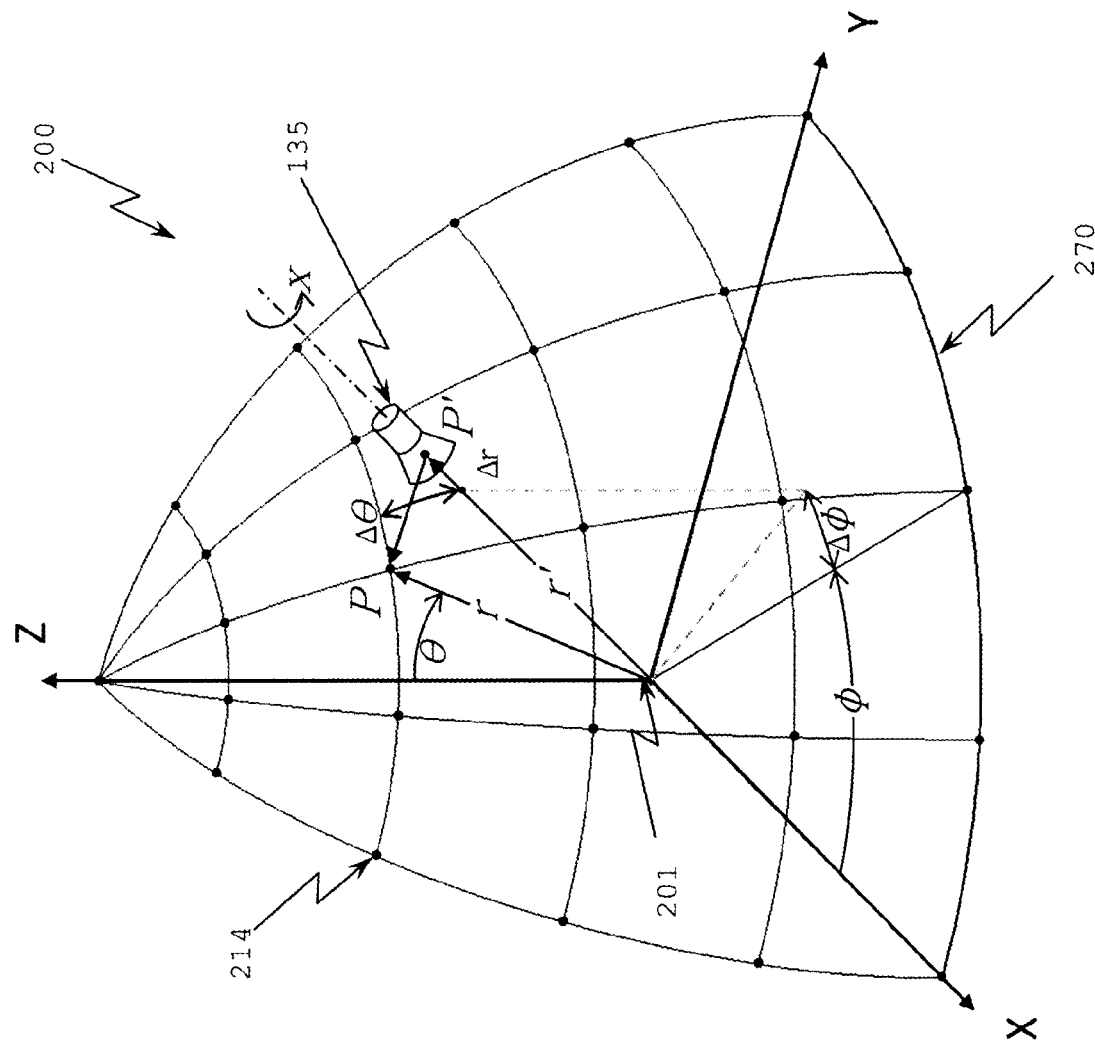
FIG. 2 illustrates an exemplary measurement surface and global position coordinate grid.

FIG. 2 illustrates, in greater detail, the aforementioned global coordinate system 200 defined by an X-axis 202, Y-axis 203 and Z-axis 204, having a coordinate origin 201. Illustrated within this global coordinate system 200 is a representative point P having a spherical coordinate location defined by r, θ, and ϕ, as illustrated in FIG. 2. Thus, point P can be represented as P(r, θ, ϕ). Point P is representative of a plurality of discrete measurement points 214 located on an ideal measurement surface 270. The plurality of points 214 are equally spaced apart along angles θ, and ϕ. The actual spacing is, at least in part, defined by the frequency and dimensional characteristics of the DUT 110 and satisfying the Nyquist criteria as discussed below.

Global coordinate system 200 also includes a representative point P' having a spherical coordinate location defined by r', θ', and ϕ'. Point P' can be represented as P'(r', θ', ϕ'). Point P' is representative of a plurality of points each of which represents an actual location of probe 135 when an RF measurement is taken. Point P'(r', θ', ϕ'), for example, represents the location of probe 135 when an RF measurement was intended to be made at corresponding point P(r, θ, ϕ). Thus, point P' is located on a non-ideal measurement surface (not shown), where the plurality of points are not located at equally spaced angles of θ', and ϕ'.

FIG. 2 further illustrates a probe 135 having a χ axis. Probe 135 is shown as being located at point P', as discussed above. System 100 may be used to command the probe 135 to move to or scan over the plurality of points 214 and may further be used to measure energy radiated by DUT 110. In commanding the probe 135 to move or scan over the point P, residual errors in positioning the probe 135 are present and denoted in global coordinate system 200 as Δr(r'-r), Δθ, and Δϕ. These residual errors result in the probe 135 achieving an actual position represented by P' when a corresponding RF measurement is taken by system 100.

FIG. 2 further illustrates how near-field radiation pattern data can be acquired, for example, by using system 100. Near-field radiation pattern data may be collected by transmitting an RF voltage signal through DUT 110 (using signal source 141) at wavelength of interest λ, and detecting the transmitted RF signal (in amplitude and phase) using probe 135. With probe 135 commanded to a plurality of points, over a scan surface 270, but achieving the plurality of non-ideal measurement points the transmitted RF voltage signal is detected for a plurality of orientations such that data is acquired at non-equally spaced points over a measurement surface (not shown).

Figure 3:
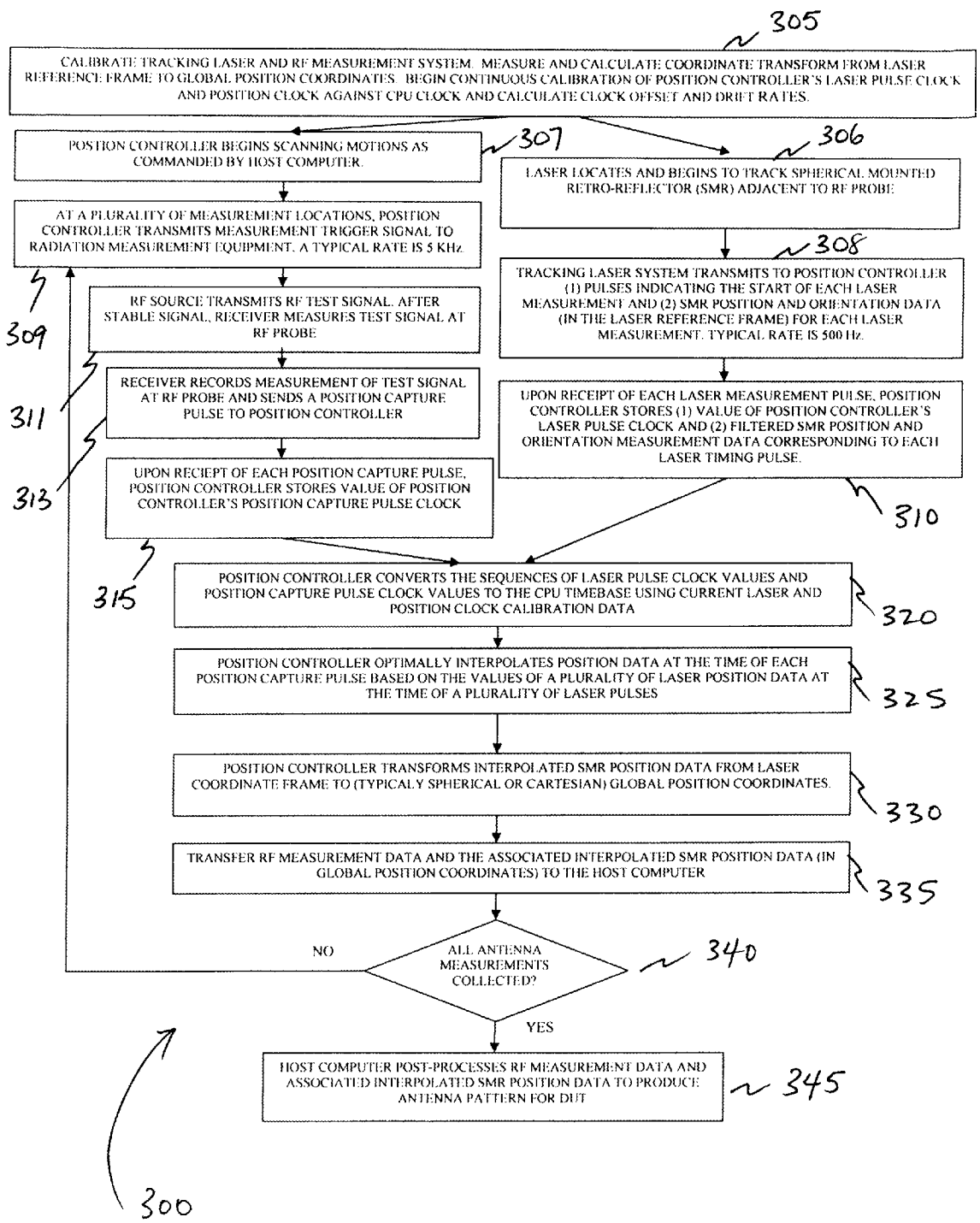
FIG. 3 is a flowchart depicting a method in accordance with exemplary embodiments of the present invention

FIG. 3 is a flowchart illustrating a process 300 for simultaneously taking RF measurements and capturing probe position data in accordance with an exemplary embodiment of the present invention. As illustrated in step 305, the process may begin by calibrating the high speed tracking laser and RF measurement system. Calibration of the high speed tracking laser may involve determining the precise location of the laser in the global position coordinate system. This would involve measuring and calculating the coordinate transform from the laser reference frame to the global position coordinates. As explained above, the global position coordinate system is defined by a plurality of monuments in known positions relative to the global position coordinate system, in the testing chamber. These monuments are marked by reflectors (e.g., SMRs). During calibration, the laser illuminates a number of the reflectors. Using common triangulation techniques, the precise location of the laser can be calculated in global position coordinates. A minimum of three reflectors would be needed for triangulation, although more accuracy may be achieved if more than three reflectors are employed, as one skilled in the art will readily appreciate. Calibration of the RF measurement system would at least involve determining the number of measurement points that must make up the measurement surface. This, in turn, is based on satisfying the Nyquist criteria given the highest frequency emitted by the DUT. Additional calibration may involve calculating offset and drift rates between the various clocks, such as the position controller CPU and the laser pulse clock.

Once the RF measurement system and the high speed laser are calibrated, the position controller begins the scanning process, as commanded by the host computer, as illustrated by step 307. As a result, the probe is moved, for example, by holding the Φ' and X' angles at a fixed value, and rotating the gantry arm so that the θ' angle changes.

In accordance with step 309, the position controller transmits an RF measurement trigger signal to the RF signal source and the receiver. When it is determined that the probe position coincides with or is in close proximity to one of the aforementioned plurality of measurement points that define, in the present example, the spherical measurement surface. A typical rate for the RF measurement trigger signal is 10 Hz.

The RF signal source causes the DUT to emit an RF test signal, as shown by step 311. When it is determined that the test signal is stabilized, the receiver measures the voltage signal (in phase and amplitude) at the probe. The receiver then stores the measurement and transmits a position capture pulse to the position controller, as shown by step 313. The position controller then stores the value of the position controller's position capture pulse clock at the time it receives the position capture pulse from the receiver, as indicated by step 315.

After the calibration operations, and in parallel with steps 307 through 315, the position controller also transmits a command signal that causes the high speed tracking laser to begin locating and tracking the SMR adjacent to the probe, as shown in step 306. As a result, the laser begins streaming to the position controller (1) laser measurement timing pulses and (2) corresponding probe position and orientation data, as shown in step 308. It should be noted that the probe position and orientation data is, at this point, in the laser reference frame. The rate of the laser timing pulses is typically 500 Hz.

As the position controller receives each laser measurement timing pulse, it stores the value of the position controller's laser pulse clock, and it stores filtered SMR position and orientation data corresponding to each laser measurement timing pulse, as described in step 310. Filtering of the SMR position and orientation data may, for example, involve low pass and Kalman filtering techniques to smooth the SMR position and orientation data.

Figure 4:
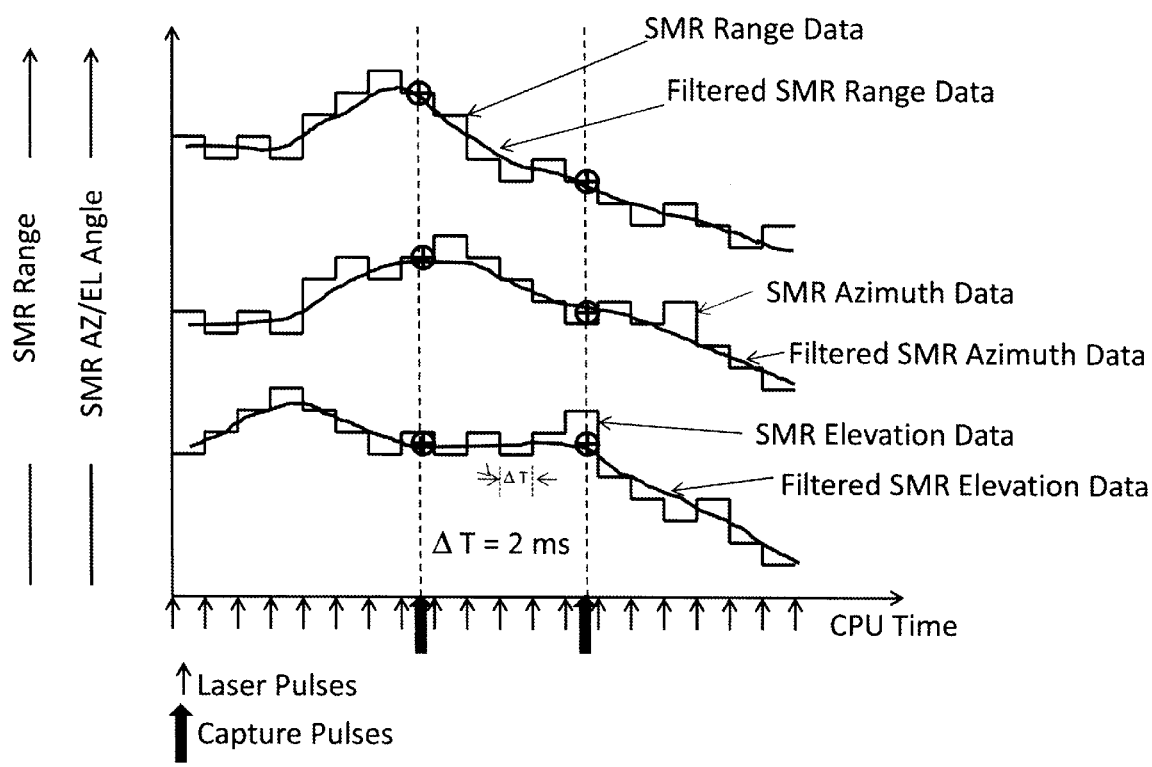
FIG. 4 illustrates filtering and interpolation techniques that may be employed on probe position and orientation data in accordance with exemplary embodiments of the present invention.

Filtering is employed because azimuth, elevation and range data from the laser tracker contains measurement noise due to servo, thermal, electrical and mechanical vibrations. Each of the three measurement signals (azimuth, elevation, range) have noise characteristics which dictate the characteristic of the optimal filter to remove such noise. The filters can be designed with either fixed or dynamic parameters. A simplistic implementation would utilize a low-pass filter for each of the three signals with a bandwidth chosen to balance noise reduction with dynamic response. A higher performance filtering method, such as a MIMO (Multiple Input Multiple Output) Kalman filter can take advantage of the knowledge that the target SMR must obey known kinematic laws which restrict the dynamic changes in the 3-D position due to inertia. FIG. 4 illustrates the exemplary filtering and interpolation processes.

As shown in step 320, the position controller must then align the position capture pulse clock and the laser pulse clock. It does so by converting the sequence of laser pulse clock values and the sequence of position capture pulse clock values to a timebase associated with the CPU clock. This allows the position controller to then align in the time domain the SMR position and orientation data and the RF measurement so that for each RF measurement, there is captured SMR position and orientation data which is both prior to and subsequent to each RF measurement trigger.

The CPU clock, laser pulse clock and position capture clocks may be implemented using a single clock, or may use two or three separate clocks. It is required to calibrate and synchronize all of the clocks in order to compare laser pulse and capture pulse times on a common timescale. All clocks are continuously calibrated for offset and drift rates in order to maximize the accuracy the measured event times. The laser tracker time stamps its measurement data with a micro-second resolution time at which each laser measurement was begun. These time stamps are in the laser tracker CPU clock time, which is unsynchronized to the position controller's CPU, trigger clock or laser clock. The time stamps are used determine when measurement data is lost in the network path from the laser tracker to the position controller. Effectively, the time stamps act as a monotonic measurement serial number and the difference between time stamps are used to detect missing laser measurement data. Missing laser measurement data is accounted for either by interpolation or simply by dropping the associated values of laser clock values for which there no laser measurement data.

The position controller further optimizes the SMR position and orientation data in accordance with step 325. This is accomplished by interpolating the position and orientation data, as mentioned above, at the time of each position capture pulse based on the values of a plurality of laser position and orientation data values.

FIG. 4 illustrates both exemplary filtering as well as interpolation processes. Typical SMR position and orientation data covers a range from 0 to 50 m, Azimuth angles from 0 to 360 degrees, and Elevation angles from ±90 degrees. Various Tracking lasers and SMRs may be used to vary these parameters.

In should be noted that the laser tracker makes position measurements at approximately equal time intervals (typically 2 msec). The exact time of these measurements is expected to drift since the laser tracker's system clock is not synchronized to the position controllers CPU clock. This is accounted for by recording the digital value of a continuously running laser pulse counter (i.e. "clock") which typically runs at 60 MHz within the position controller. In addition, measurement trigger pulses occur asynchronously from 0 to 4 KHz, or more. The exact time of each measurement trigger is captured by recording the digital value of a continuously running position counter (i.e. "clock") which typically runs at 60 MHz within the position controller. In general, the measurement trigger pulse occurs at times other than those for which a laser measurement point is known. In order to calculate the position value that the laser would have measured at the time of the measurement pulse, the position controller utilizes the sequence of laser measurements, and the times at which they were made, in order to optimally estimate the SMR position at the moment of the measurement trigger pulse. Each laser measurement contains measurement error which is partially reduced by utilizing laser measurements which are nearby in time to the measurement trigger pulse. An interpolation filter is used to combine the information of nearby (in time) measurements. Typically, a Gaussian filter with an impulse response which is non-causal, time-symmetric (zero phase) will produce an optimal interpolated estimate. A more simplistic filter could be chosen, such as a cubic Hermite spline such as Catmull-Rom, which can be efficiently computed from only four laser measurements (two prior to the trigger pulse and two after).

The position controller then transforms the filtered, interpolated SMR position and orientation data from the laser coordinate frame to global position coordinates. This is depicted in step 330. This typically involves the use of matrix methods and quaternion algebra. In FIG. 2, exemplary point P' represents the probe position in global position coordinates, which is offset from the SMR position by the fixed positional relationship between the SMR and the probe.

The position controller then transfers the filtered, interpolated SMR position and orientation data, in global position coordinates, to the host computer, as shown by step 335. The system then determines, in accordance with decision block 340, if all the measurements have been taken. In other words, a determination is made if a measurement has been made for each of the plurality of measurement points that make up the measurement surface. As explained and illustrated above, the measurement surface in the exemplary embodiment is a spherical measurement surface. If the system determines that all the measurements have not been taken, in accordance with the NO path out of decision block 340, the above describe process repeats for each additional measurement point. However, if the system determines that all the measurements have been taken, in accordance with the YES path out of decision block 340, the host computer can begin or at least continue post processing the RF measurement data based on each, actual SMR/probe position and orientation data (e.g., point P' illustrated in FIG. 2), the position of each corresponding measure point (e.g., point P illustrated in FIG. 2), and the difference there between in global position coordinates. The processing ultimately results in an accurate near-field antenna pattern, which can be further transformed to a far-field pattern using well-known techniques.

Figure 5:
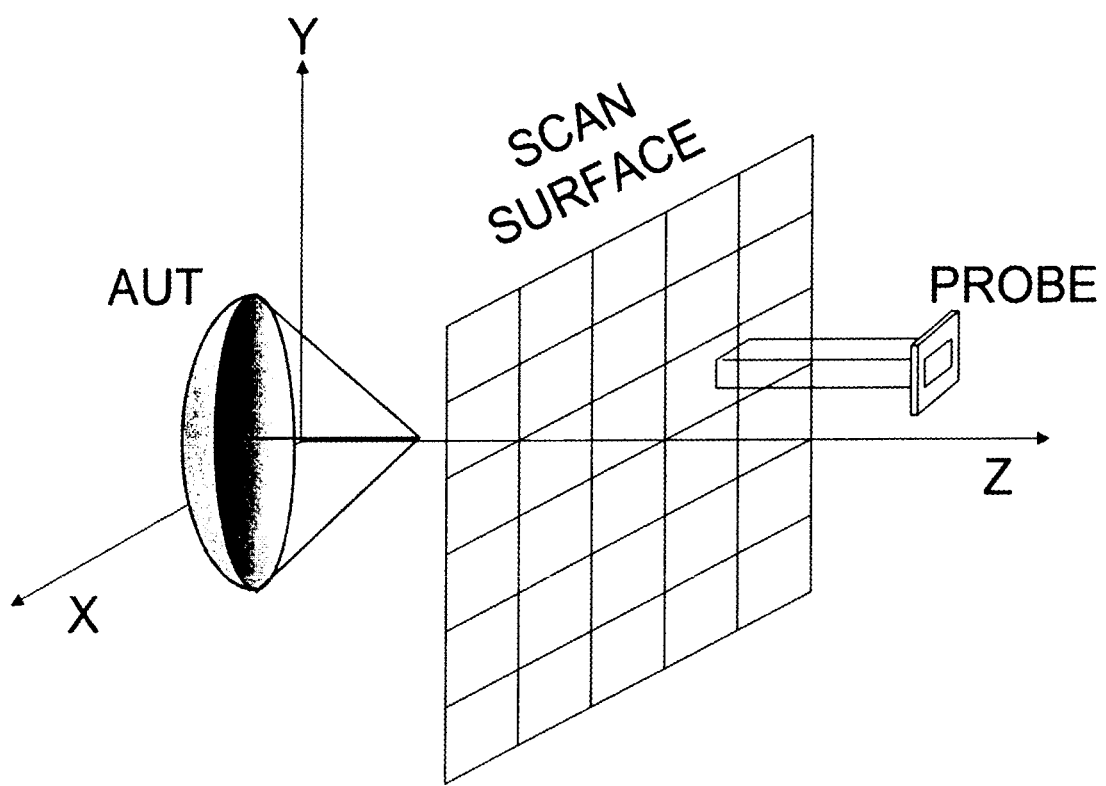
FIG. 5 illustrates a planar measurement surface.
Figure 6:
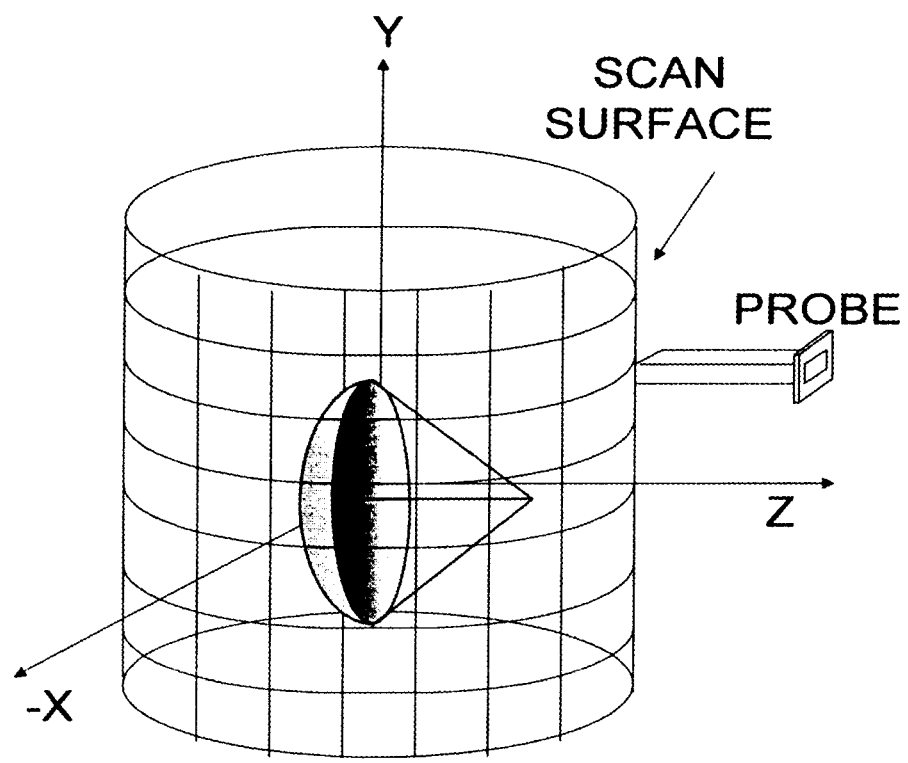
FIG. 6 illustrates a cylindrical measurement surface.

As illustrated above in FIG. 1 and FIG. 2, and as described in the exemplary embodiment, the measurement surface is spherical. It was also explained above that other geometrically shaped surfaces are possible depending on the nature of the DUT. Other more typical measurement surfaces include a cylindrical measurement surface, as illustrated in FIG. 5, and a planar measurement surface, as illustrated in FIG. 6. Those skilled in the art will readily appreciate that the mechanical structure needed to move and scan the probe may vary depending on the measurement surface.

The present invention has been described in terms of exemplary embodiments. It will be understood that the certain modifications and variations of the various features described above with respect to these exemplary embodiments are possible without departing from the spirit of the invention.

What is claimed is:

1. A method for generating a radiation pattern for a device under test, the method comprising:
   determining a location of a tracking laser within a global position coordinate system (GPCS), the GPCS being defined by a plurality of monuments,
   commanding a radiation detection probe to move towards or in proximity to each of a plurality of desired measurement points positioned on a measurement surface surrounding or adjacent to the device under test;
   measuring, utilizing the tracking laser, actual probe position data relative the plurality of monuments;
   measuring radiation at the probe associated with transmissions from the device under test;
   synchronizing actual probe position data and a radiation measurement for each of a plurality of actual measurement points; and
   calculating the radiation pattern as a function of the actual probe position data at each of the plurality of actual measurement points, in global position coordinates, and corresponding radiation measurements.

2. The method of claim 1 further comprising:
   transforming each of the actual probe position measurements into global position coordinates.

3. The method of claim 1, wherein the plurality of monuments comprise spherically mounted retroreflectors (SMRs) at known fixed near-field locations.

4. A radiation measurement system capable of generating a radiation pattern for a device under test, the system comprising:
   a global position coordinate system (GPCS), the GPCS being defined by a plurality of monuments,
   a radiation detection probe mounted to a fixture capable of moving the radiation detection probe towards or in proximity to each of a plurality of desired measurement points positioned on a measurement surface surrounding or adjacent to the device under test;
   a laser tracker located within the GPCS using the plurality of monuments and positioned such that it is capable of locating and tracking relative the plurality of monuments a reflector that is in a fixed position relative to the radiation detection probe;
   a receiver in communication with the radiation detection probe such that it is capable of measuring radiation emitted by the device under test;
   a position controller in communication with the fixture, the device under test, and the receiver, the position controller programmed to control the radiation transmissions of the device under test and to control the fixture so as to move the radiation detection probe towards or in proximity to each of a plurality of desired measurement points, and wherein the position controller is configured to receive actual probe position data measurements from the laser tracker and synchronize actual probe position data and a radiation measurement for each of a plurality of actual measurement points; and
   a host computer in communication with the receiver and the position controller, the host computer programmed to calculate the radiation pattern as a function of the actual probe position data at each of the plurality of actual measurement points, in global position coordinates, and corresponding radiation measurements.

5. The system of claim 4, wherein the position controller is further configured to transform each of the actual probe position measurements into global position coordinates.

6. The system of claim 4, wherein the plurality of monuments comprise spherically mounted retroreflectors (SMRs) at known fixed near-field locations.

* * * * *